(12) United States Patent
Brandenburg et al.

(10) Patent No.: US 11,315,852 B2
(45) Date of Patent: Apr. 26, 2022

(54) THERMAL INTERFACE LAYER FOR ELECTRONIC DEVICE

(71) Applicant: APTIV TECHNOLOGIES LIMITED, St. Michael (BB)

(72) Inventors: Scott D. Brandenburg, Kokomo, IN (US); David W. Zimmerman, Noblesville, IN (US)

(73) Assignee: APTIV TECHNOLOGIES LIMITED, St. Michael (BB)

( * ) Notice: Subject to any disclaimer, the term of this patent is extended or adjusted under 35 U.S.C. 154(b) by 0 days.

(21) Appl. No.: 16/599,712

(22) Filed: Oct. 11, 2019

(65) Prior Publication Data

US 2021/0111096 A1     Apr. 15, 2021

(51) Int. Cl.
*H01L 23/373*     (2006.01)
*H01L 23/367*     (2006.01)
*H05K 7/20*       (2006.01)

(52) U.S. Cl.
CPC ...... *H01L 23/3733* (2013.01); *H01L 23/3677* (2013.01); *H05K 7/20927* (2013.01)

(58) Field of Classification Search
CPC ........... H01L 23/49568; H01L 23/3107; H01L 23/367; H01L 23/3737; H01L 23/49541; H01L 23/373; H01L 23/3735; H01L 23/467; H01L 23/3733; H01L 23/3677; H05K 3/108; H05K 3/382; H05K 7/20954; H05K 7/2039; H05K 7/20927
See application file for complete search history.

(56) References Cited

U.S. PATENT DOCUMENTS

| | | | |
|---|---|---|---|
| 4,523,528 A * | 6/1985 | Hastings | ................. B32B 19/04 109/11 |
| 5,316,080 A | 5/1994 | Banks et al. | |
| 6,407,922 B1 | 6/2002 | Eckblad et al. | |
| 7,230,832 B2 | 6/2007 | Brandenburg et al. | |
| 7,486,515 B2 | 2/2009 | Brandenburg et al. | |
| 8,699,225 B2 | 4/2014 | Brandenburg et al. | |
| 9,131,630 B2 | 9/2015 | Brandenburg et al. | |
| 2005/0061474 A1* | 3/2005 | Gelorme | ............... H01L 23/433 165/80.2 |
| 2006/0118925 A1* | 6/2006 | Macris | .................. H01L 23/433 257/667 |
| 2006/0137856 A1* | 6/2006 | Popovich | ................ F28F 3/022 165/80.4 |
| 2006/0220225 A1* | 10/2006 | Ni | ......................... H01L 23/433 257/712 |
| 2007/0114657 A1* | 5/2007 | Dangelo | ............... H01L 23/373 257/720 |

(Continued)

OTHER PUBLICATIONS

Unpublished U.S. Appl. No. 16/520,862, filed Jul. 24, 2019, Liquid Cooled Module With Device Heat Spreader, Brandenburg, Scott D.

*Primary Examiner* — Adam B Dravininkas
(74) *Attorney, Agent, or Firm* — Carlson, Gaskey & Olds, P.C.

(57) ABSTRACT

An electronic device includes a printed circuit board that supports an integrated circuit (IC) chip and a thermal interface layer that is configured to transfer thermal energy from the IC chip. The thermal interface layer includes a containment frame that is non-electrically conductive and a thermal conductance pane that is inset in the containment frame.

18 Claims, 2 Drawing Sheets

(56) References Cited

U.S. PATENT DOCUMENTS

| | | | |
|---|---|---|---|
| 2007/0114658 A1* | 5/2007 | Dangelo | H01L 23/373 257/720 |
| 2007/0127211 A1* | 6/2007 | Macris | H01L 23/42 361/700 |
| 2008/0227236 A1* | 9/2008 | Luch | H01L 31/0392 438/73 |
| 2012/0006521 A1 | 1/2012 | Moehlenkamp et al. | |
| 2012/0281361 A1* | 11/2012 | Gunderson | H05K 7/20472 361/707 |
| 2014/0070393 A1* | 3/2014 | Bartley | H01L 23/373 257/690 |
| 2014/0217574 A1* | 8/2014 | Kuczynski | H01L 23/42 257/713 |
| 2014/0252404 A1 | 9/2014 | Takayama et al. | |
| 2015/0282380 A1* | 10/2015 | De Bock | H01L 23/42 361/704 |
| 2017/0317005 A1 | 11/2017 | Standing | |
| 2018/0098461 A1* | 4/2018 | Matsuno | G02F 1/133382 |
| 2018/0374714 A1* | 12/2018 | Stathakis | H01L 23/373 |
| 2020/0006187 A1* | 1/2020 | Otremba | H01L 23/42 |

* cited by examiner

THERMAL INTERFACE LAYER FOR ELECTRONIC DEVICE

BACKGROUND

Vehicle driver assistance systems utilize controllers, such as a multi-domain controllers, that have multiple integrated circuit (IC) chips. The IC chips often generate significant amounts of waste heat. Removal of the waste heat to ensure reliable operation is challenging, and next-generation IC chips are expected to generate even greater amounts of waste heat.

One approach to removing the waste heat involves use of a heat sink on the topside of the IC chip. In order to enhance heat transfer a thermal interface material is used between the IC chip and the heat sink. Thermal interface materials typically include metals or graphite for high thermal conductivity. Such materials, however, are also electrically conductive and can cause electrical short circuits if they migrate from the interface.

SUMMARY

An electronic device according to an example of the present disclosure includes a printed circuit board that supports an integrated circuit (IC) chip, and a thermal interface layer that is configured to transfer thermal energy from the IC chip. The thermal interface layer includes a containment frame that is non-electrically conductive, and a thermal conductance pane inset in the containment frame.

In a further embodiment of any of the foregoing embodiments, the containment frame includes a porous structure.

In a further embodiment of any of the foregoing embodiments, the porous structure is a mesh.

In a further embodiment of any of the foregoing embodiments, the containment frame includes a composite material disposed in pores of the porous structure.

In a further embodiment of any of the foregoing embodiments, the composite material includes a polymer.

In a further embodiment of any of the foregoing embodiments, the composite material includes non-electrically conductive particles.

In a further embodiment of any of the foregoing embodiments, the non-electrically conductive particles are selected from the group consisting of alumina, boron nitride, aluminum nitride, and combinations thereof.

In a further embodiment of any of the foregoing embodiments, the composite material includes, by weight, less than 5% of the non-electrically conductive particles.

In a further embodiment of any of the foregoing embodiments, the composite material has a softening point of 40° C. to 70° C.

In a further embodiment of any of the foregoing embodiments, the thermal conductance pane is composed of a thermally conductive material selected from the group consisting of copper metal, aluminum metal, graphite, and combinations thereof.

In a further embodiment of any of the foregoing embodiments, the thermal conductance pane defines side edges, the containment frame defines inside edges that circumscribe an interior opening, the thermal conductance pane is inset in the interior opening, and the side edges of the thermal conductance pane are secured to the inside edges of the containment frame.

In a further embodiment of any of the foregoing embodiments, the porous structure is a mesh, the containment frame includes a composite material disposed in pores of the mesh, and the thermal conductance pane is composed of a thermally conductive material selected from the group consisting of copper metal, aluminum metal, graphite, and combinations thereof.

A thermal interface layer for transferring thermal energy from an integrated circuit chip according to an example of the disclosure includes a containment frame that is non-electrically conductive; and a thermal conductance pane inset in the containment frame.

In a further embodiment of any of the foregoing embodiments, the containment frame includes a porous structure and a composite material disposed in pores of the porous structure.

In a further embodiment of any of the foregoing embodiments, the composite material has a softening point of 40° C. to 70° C.

In a further embodiment of any of the foregoing embodiments, the thermal conductance pane is composed of a thermally conductive material selected from the group consisting of copper metal, aluminum metal, graphite, and combinations thereof, the thermal conductance pane defines side edges, the containment frame defines inside edges that circumscribe an interior opening, the thermal conductance pane is inset in the interior opening, and the side edges of the thermal conductance pane are secured to the inside edges of the containment frame.

In a further embodiment of any of the foregoing embodiments, the porous structure is a mesh, the containment frame includes a composite material disposed in pores of the mesh.

A method for fabricating a thermal interface layer according to an example of the present disclosure includes providing a containment frame that is non-electrically conductive, and insetting a thermal conductance pane in the containment frame.

In a further embodiment of any of the foregoing embodiments, the providing includes introducing a composite material into pores of a porous structure to form a blank frame.

In a further embodiment of any of the foregoing embodiments, the providing further includes removing an interior region from the blank frame to form the containment frame with inside edges that circumscribe an interior opening.

In a further embodiment of any of the foregoing embodiments, the insetting includes mounting the thermal conductance pane in the interior opening.

BRIEF DESCRIPTION OF THE DRAWINGS

The various features and advantages of the present disclosure will become apparent to those skilled in the art from the following detailed description. The drawings that accompany the detailed description can be briefly described as follows.

DETAILED DESCRIPTION

Figure 1:
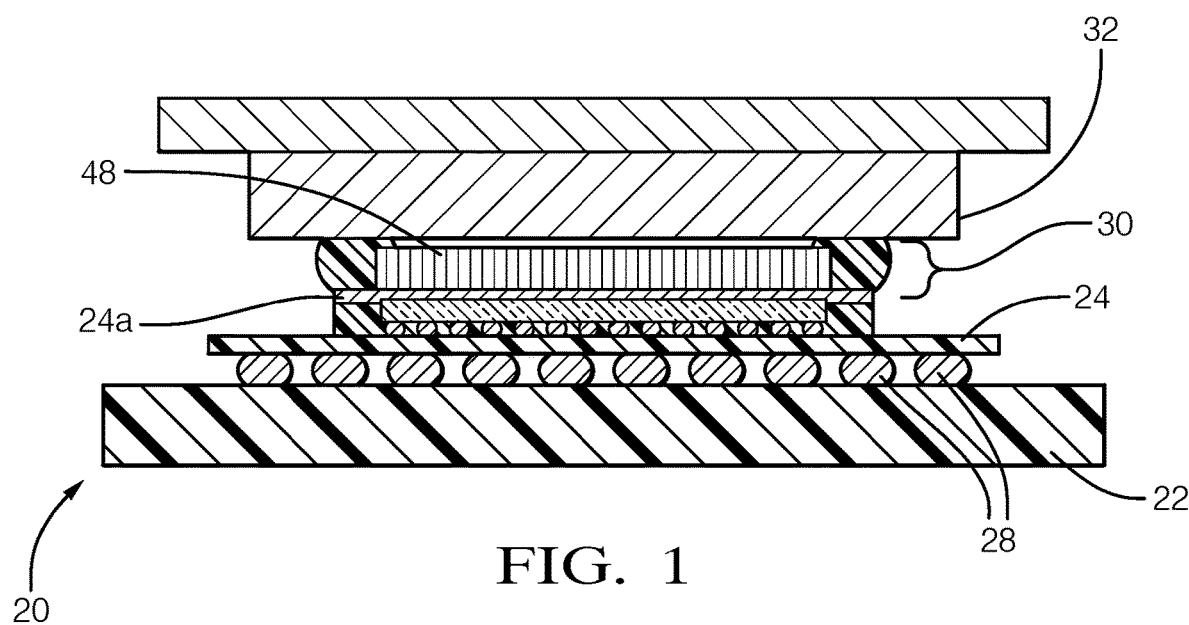
FIG. 1 illustrates an example electronic device.

FIG. 1 illustrates a sectioned view of an electronic device 20. The electronic device 20 may be, but is not limited to, a multi-domain controller for a vehicle driver assistance system. The electronic device 20 generally includes a printed circuit board 22 ("PCB 22") and an integrated circuit chip 24 ("IC chip 24") supported on the PCB 22. As shown, the IC chip 24 is supported on the PCB 22 via an interposer board 26 and solder balls 28. It is to be appreciated, however, that other mounting approaches may alternatively be employed.

The IC chip 24 may generate waste thermal energy of approximately 200 Watts up to approximately 1000 Watts. In this regard, the electronic device 20 includes a thermal interface layer 30 that conducts and transfers thermal energy away from the IC chip 24. In the illustrated example, the thermal energy is rejected to a thermal dissipation device 32, such as a heat sink, adjacent the thermal interface layer 30. A metal layer 24a on the topside of the IC chip 24 may facilitate transfer of thermal energy from the IC chip 24 to the thermal interface layer 30.

Figure 2:
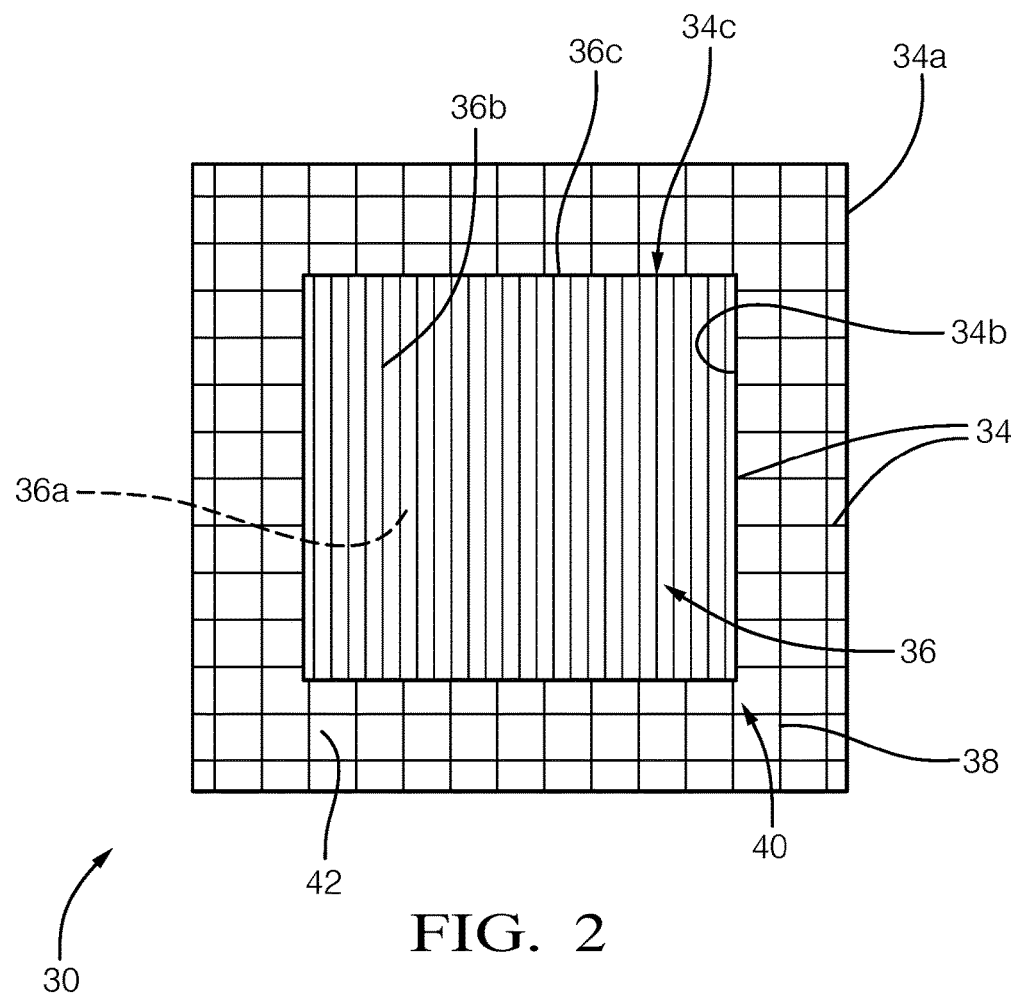
FIG. 2 illustrates a thermal interface layer.

FIG. 2 illustrates an isolated plan view of the thermal interface layer 30. The thermal interface layer 30 includes a containment frame 34 that is non-electrically conductive and a thermal conductance pane 36 that is inset in the containment frame 34. The containment frame 34 is a border that defines outside edges 34a and inside edges 34b. The inside edges 34b circumscribe an interior opening 34c. The thermal conductance pane 36 is inset in the interior opening 34c. In general, the containment frame 34 and the thermal conductance pane 36 are of equal thickness such that the thermal conductance pane 36 is flush with the containment frame 34.

The thermal conductance pane 36 is generally planar and defines a heat-input surface 36a, a heat-output surface 36b, and side edges 36c. The heat-input surface 36a faces toward the IC chip 24 and the heat-output surface faces toward the thermal dissipation device 32. The side edges 34c of the thermal conductance pane 36 are secured to the inside edges 34b of the containment frame 34, which is described in further detail below.

The containment frame 34 is composed of a porous structure 38 that is non-electrically conductive. The porous structure 38 includes pores 40. In the illustrated example, the porous structure 38 is a mesh of networked fibers or wires. For example, the porous structure 38 is composed of a polymer-based composition or a glass composition.

The containment frame 34 further includes a composite material 42 disposed in the pores 40 of the porous structure 38. The composite material 42 fills the pores 40 and is also electrically non-conductive. As used herein, an electrically conductive material is a material, such as copper metal, aluminum metal, or graphite, which permits electric current to easily flow, and an electrically non-conductive material is a material which does not permit electric current to easily flow.

As an example, the composite material 42 is a resin that is composed of a blend of constituent substances. The constituent substances may include, but is not limited to, wax, polymer, organic binder, tackifying agents, and plasticizers. In one example, the composite material has a softening point of 40° C. to 70° C. Such a softening point permits processing at relatively low temperatures but also allows the thermal interface layer 30 to soften or even melt during operation to deform and mitigate stresses caused by mismatches in coefficient of thermal expansion between the IC chip 24 and the thermal dissipation device 32. The composite material 42 may be repeatedly softened or melted and thus may be considered to be a thermoplastic material. In the softened or melted state, the pores 40 also retain the composite material 42 by preventing the composite material from flowing out of the thermal interface layer 30.

Figure 3:
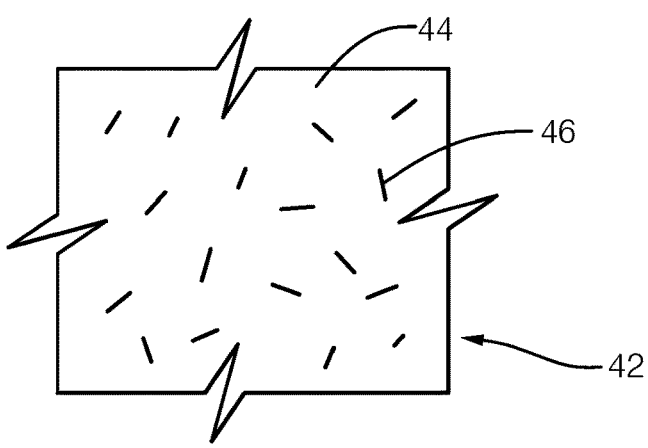
FIG. 3 illustrates a composite material that has non-electrically conductive particles.

FIG. 3 illustrates a representative portion of a modified example of the composite material 42. In this example, the resin as described above is represented at 44. The composite material 42 further includes non-electrically conductive particles 46 dispersed through the resin 44. The resin 44 thus serves as a matrix in which the particles 46 are embedded. The resin 44 generally has poor thermal conductivity. The particles 46 have a higher thermal conductivity than the resin and thus serve to increase the thermal conductivity of the composite material 42. As an example, the particles 46 are composed of alumina, boron nitride, aluminum nitride, or combinations thereof.

The composite material 42 contains a relatively low amount of the particles 46, to avoid altering other desired physical properties of the composite material 42. For instance, the composite material 42 includes, by weight percent, approximately 0.5% to 5% of the particles 46.

The thermal conductance pane 36 is composed of a thermally conducting material. Example materials include, but are not limited to, copper metal, aluminum metal, and graphite. The thermal conductance pane 36 may be composed exclusively of the thermally conducting material or materials, or alternatively of a composite material that includes the thermally conducting material or materials. In one example, which is demonstrated in FIG. 1, the thermal conductance pane 36 is composed of oriented fibers 48 of the thermally conducting material, such as graphite fibers. For instance, the fibers 48 are unidirectionally vertically oriented such that the axial direction of the fibers 48 is approximately orthogonal to the plane of the IC chip 24, to facilitate enhanced thermal conductance.

In the thermal interface layer 30 the thermal conductance pane 36 serves to conduct and transfer thermal energy from the IC chip 24. The thermally conducting material used in the thermal conductance pane 36, however, is also electrically conductive. Thus, if the thermally conducting material were to migrate from the thermal conductance pane 36 it could cause an electrical short circuit between electrical components elsewhere in the electronic device 20. The containment frame 34 continuously surrounds the perimeter of the thermal conductance pane 36 and prevents the material of the thermal conductance pane 36 from migrating laterally (in the plane of the thermal interface layer 30). In this regard, the containment frame 34 serves to confine the material of the thermal conductance pane 36, thereby reducing the chances of migration and short-circuiting.

Additionally, while the containment frame 34 may transfer some thermal energy, it is generally a poor thermal conductor in comparison to the thermal conductance pane 36. In this regard, the areal size of the thermal interface layer 30 is substantially larger than the areal size of the containment frame 34. For instance, the areal size of the thermal conductance pane 36 is larger than the areal size of the containment frame by a factor of at least 2, but more preferably by a factor of at least 5 or at least 10.

Figure 4:
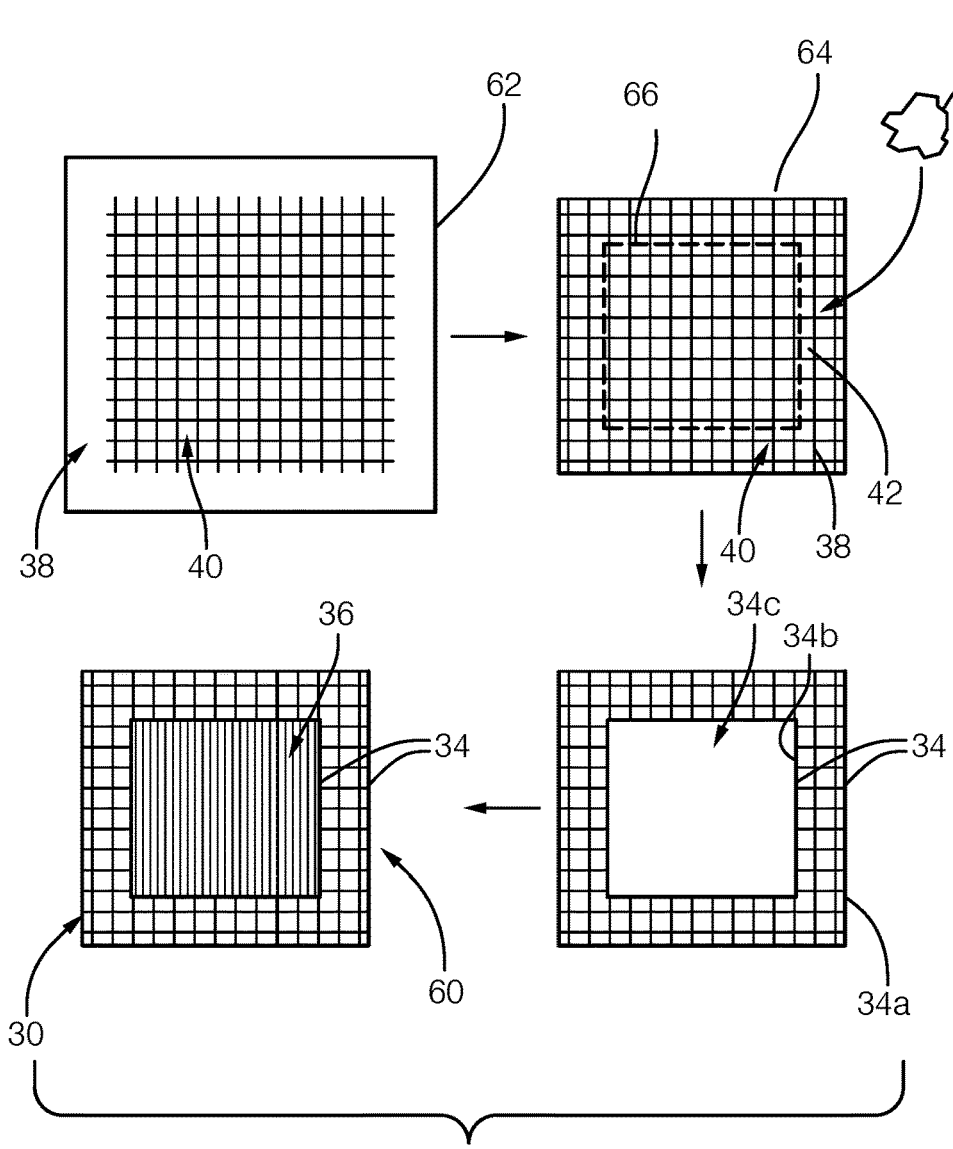
FIG. 4 illustrates a method for fabricating a thermal interface layer.

FIG. 4 depicts a method 60 of fabricating the thermal interface layer 30. The method 60 initially includes providing the porous structure 38, as shown in the upper left-hand portion of the figure. At this point, the pores 40 of the porous structure 38 are unfilled. The porous structure 38 can be provided on a carrier sheet 62. For instance, the carrier sheet 62 is composed of polytetrafluoroethylene, polyester, or polyimide, but other carrier sheets may alternatively be used. The carrier sheet 62 facilitates handling of the porous structure 38 and, in some examples, may support multiple porous structures 38 for co-processing to fabricate multiple thermal interface layers 30 at once.

Next, as shown in the upper right-hand portion of the figure, the composite material 42 is introduced into the pores 40 of the porous structure 38 to form a blank frame 64. In one example, the composite material 42 is introduced using a screen printing process. For instance, the composite material 42 is heated to a liquid in the screen printing process and the liquid is then dispensed into the pores 40. The liquid then cools and solidifies so as to be retained in the pores 40. The printing may be repeated over multiple iterations to completely fill the pores 40. In this regard, the carrier sheet 62 serves as the "floor" of the pores 40 to support the liquid in the pores 40 prior to cooling into solid form.

Next, an interior region 66 of the blank frame 64 is removed, as shown in the lower right-hand portion of the figure. For example, the interior region 66 is removed using a stamping process, although other removal techniques could alternatively be used. The removal of the interior region 66 creates the interior opening 34c.

Finally, as shown in the lower left-hand portion of the figure, the thermal conductance pane 36 is inset into the containment frame 34. The insetting includes placing the thermal conductance pane 36 in the interior opening 34c. The geometry of the interior opening 34c is approximately the same as the geometry of the thermal conductance pane 36 such that the thermal conductance pane 36 fits closely into the interior opening 34c. The containment frame 34 may be heated such that the composite material 42 reflows around the side edges 36c of the thermal conductance pane 36, to secure the pane 36 to the frame 34.

The resulting thermal interface layer 30 may then be provided for assembly into the electronic device 20. For instance, the thermal interface layer 30 may remain on the carrier sheet 62 after fabrication. A pick-and-place machine may then be used to remove the thermal interface layer 30 from the carrier sheet 62 and place it on the thermal dissipation device 32 or on the topside of the IC chip 24. The thermal interface layer 30 may be heated during the placement process to tackify the composite material 42 so that the thermal interface layer 30 adheres to the thermal dissipation device 32 or IC chip 24.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from this disclosure. The scope of legal protection given to this disclosure can only be determined by studying the following claims.

What is claimed is:

1. An electronic device comprising:
 a printed circuit board supporting an integrated circuit (IC) chip; and
 a thermal interface layer configured to transfer thermal energy from the IC chip,
 the thermal interface layer including
  a porous mesh and a polymer disposed in pores of the porous mesh, the porous mesh and the polymer defining a containment frame that is a border defining outside edges and inside edges, the inside edges circumscribing an interior opening, and
  a thermal conductance pane inset in the interior opening of the containment frame, and outside edges of the thermal conductance pane are secured to the inside edges of the border.

2. The electronic device as recited in claim 1, wherein the polymer is a composite with non-electrically conductive particles disposed in the polymer.

3. The electronic device as recited in claim 2, wherein the non-electrically conductive particles are selected from the group consisting of alumina, boron nitride, aluminum nitride, and combinations thereof.

4. The electronic device as recited in claim 3, wherein the composite material includes, by weight, less than 5% of the non-electrically conductive particles.

5. The electronic device as recited in claim 4, wherein the composite material has a softening point of 40° C. to 70° C.

6. The electronic device as recited in claim 1, wherein the thermal conductance pane is composed of a thermally conductive material selected from the group consisting of copper metal, aluminum metal, graphite, and combinations thereof.

7. The electronic device as recited in claim 1, wherein the mesh is formed of at least one of glass fibers or polymer fibers.

8. The electronic device as recited in claim 1, wherein the thermal conductance pane is flush with the containment frame.

9. The electronic device as recited in claim 1, wherein the thermal conductance pane include unidirectionally oriented fibers.

10. The electronic device as recited in claim 9, wherein the thermal conductance pane is planar and the unidirectionally oriented fibers are orthogonal to the thermal conductance pane.

11. The electronic device as recited in claim 1, wherein the porous mesh is a three-dimensional structure.

12. The electronic device as recited in claim 1, wherein the thermal conductance pane includes a planar heat-input surface and a planar heat-output surface, and except for the outside edges of the thermal conductance pane, the mesh and polymer are absent from the planar heat-input surface and the planar heat-output surface.

13. A thermal interface layer for transferring thermal energy from an integrated circuit chip, comprising:
 a porous mesh and a polymer disposed in pores of the porous mesh, the porous mesh and the polymer defining a containment frame that is a border defining outside edges and inside edges, the inside edges circumscribing an interior opening; and
 a thermal conductance pane inset in the interior opening of the containment frame, and outside edges of the thermal conductance pane are secured to the inside edges of the border.

14. The thermal interface layer as recited in claim 13, wherein the polymer is a composite material with non-electrically conductive particles disposed in the polymer.

15. The thermal interface layer as recited in claim 14, wherein the composite material has a softening point of 40° C. to 70° C.

16. The thermal interface layer as recited in claim 13, wherein the thermal conductance pane is composed of a thermally conductive material selected from the group consisting of copper metal, aluminum metal, graphite, and combinations thereof.

17. A method for fabricating a thermal interface layer, the method comprising:
 providing a containment frame that is non-electrically conductive, wherein the containment frame is a border that defines outside edges and inside edges, and the inside edges circumscribe an interior opening; and insetting a thermal conductance pane in the interior opening of the containment frame, and outside edges of the thermal conductance pane are secured to the inside edges of the border, the containment frame being comprised of a mesh defining pores and a polymer filling the pores.

18. The method as recited in claim 17, wherein the providing includes introducing the polymer into the pores of the mesh to form a blank frame.

* * * * *